United States Patent [19]

Yaba et al.

[11] Patent Number: 5,059,254

[45] Date of Patent: Oct. 22, 1991

[54] SOLAR CELL SUBSTRATE AND SOLAR PANEL FOR AUTOMOBILE

[75] Inventors: Susumu Yaba; Tomoya Takigawa; Kikugawa; Koichi Osada; Katsuhito Sato, all of Yokohama; Masaru Omae, Kanagawa, all of Japan

[73] Assignee: Asahi Glass Company Ltd., Tokyo, Japan

[21] Appl. No.: 356,234

[22] Filed: May 24, 1989

[30] Foreign Application Priority Data

May 24, 1988 [JP] Japan .................................. 63-124890
Apr. 24, 1989 [JP] Japan ..................................... 1-48042

[51] Int. Cl.⁵ .......................................... H01L 31/048
[52] U.S. Cl. .................................... 136/251; 136/244; 136/256; 136/258; 136/291
[58] Field of Search ....... 136/244, 251, 256, 258 AM, 136/259, 291; 428/432

[56] References Cited

U.S. PATENT DOCUMENTS 4,625,070 11/1986 Berman et al. ...................... 136/249
4,686,321 8/1987 Kishi ................................... 136/244
4,717,790 1/1988 Gochermann ....................... 136/251

FOREIGN PATENT DOCUMENTS

| 0218997 | 4/1987 | European Pat. Off. ............ 136/257 |
| 3239676 | 5/1984 | Fed. Rep. of Germany ...... 136/251 |
| 2531813 | 2/1984 | France ................................. 136/244 |
| 2550007 | 2/1985 | France ................................. 136/244 |
| 2550385 | 2/1985 | France ................................. 136/251 |
| 0221287 | 9/1986 | France ................................. 136/251 |
| 58-50782 | 3/1983 | Japan .................................. 136/291 |

OTHER PUBLICATIONS

Patent Abstracts of Japan, vol. 8, No. 250 (E-279) (1687), 16 Nov. 1984.

Primary Examiner—Aaron Weisstuch
Attorney, Agent, or Firm—Oblon, Spivak, McClelland, Maier & Neustadt

[57] ABSTRACT

A glass substrate for a solar cell, comprising a glass sheet having a curved surface shape and a transparent electroconductive film formed on the concave surface side of said glass sheet.

19 Claims, 9 Drawing Sheets

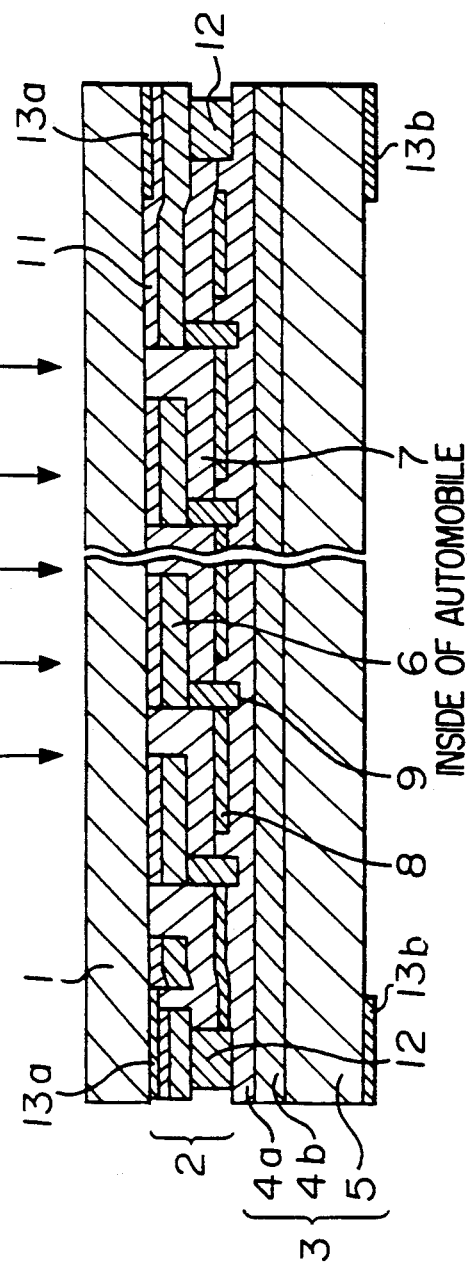
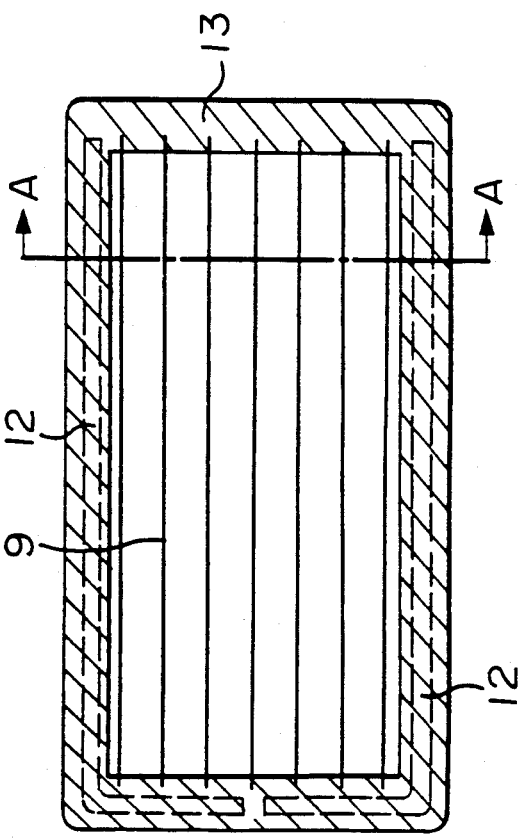

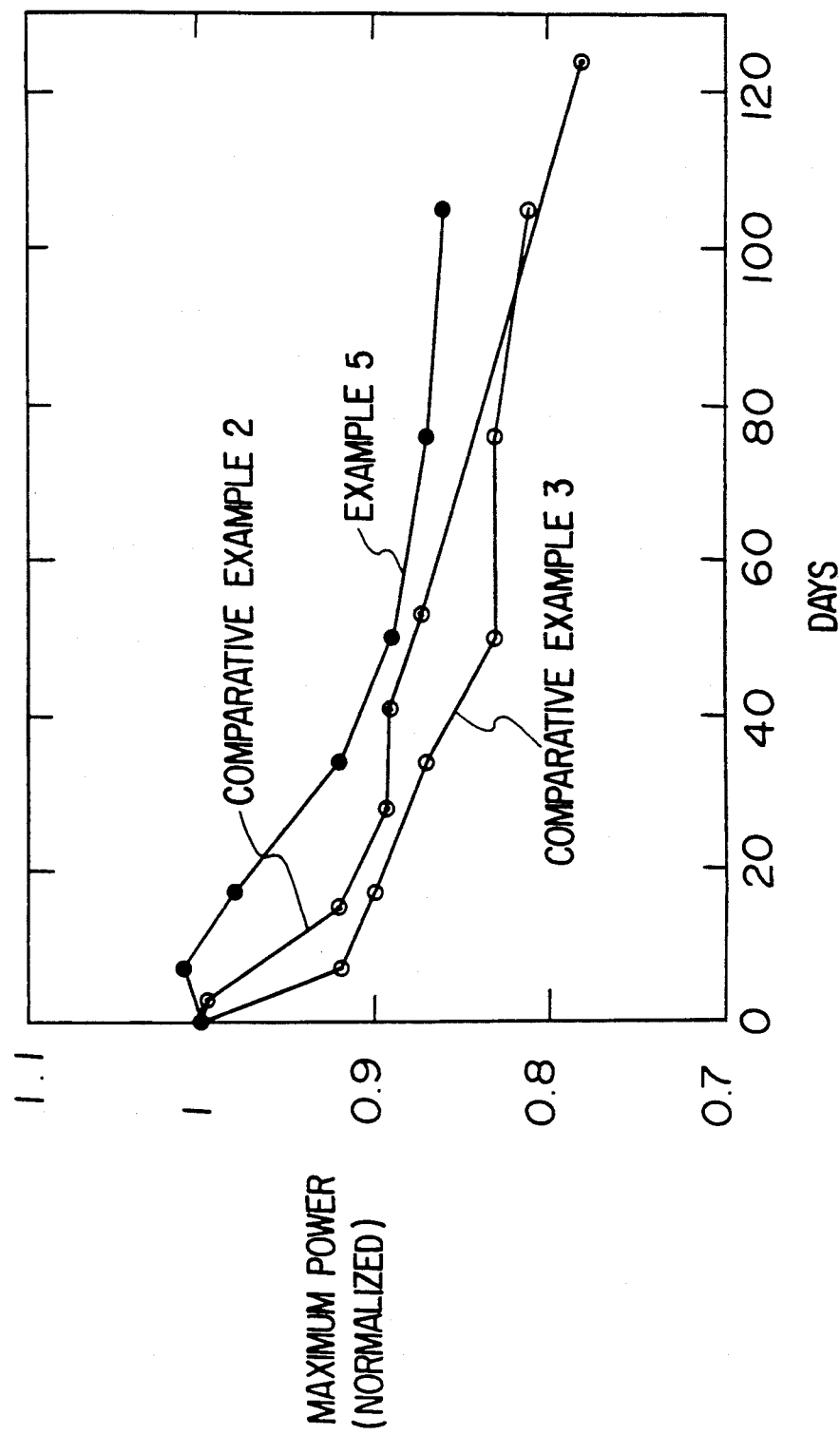

SOLAR CELL SUBSTRATE AND SOLAR PANEL FOR AUTOMOBILE

This invention relates to a glass substrate for a solar cell having a curved surface suitable for a window glass panel for an automobile, a method for producing the same, and a solar cell. Particularly, it relates to a solar cell-installed window glass panel for an automobile. More particularly, it relates to such window glass panel for an automobile transparent to visible light, particularly suitable as a sunroof, opera window or the like for an automobile.

A solar cell is regarded as a prospective photoelectric conversion apparatus which is capable of cleanly producing electric power without causing environmental pollution by using sunlight as an inexhaustible energy source unlike other energy sources such as petroleum, coal or natural gas.

Among such solar cells, a solar cell using amorphous silicon (a-Si) as a semi-conductor layer for effecting photoelectric conversion is widely used since it can be produced at a relatively low cost and it assures a relatively satisfactory photoelectric conversion efficiency. As a typical example of such an amorphous silicon (a-Si) solar cell, FIG. 4 illustrates an a-Si solar cell 48 having an a-Si semiconductor layer 46 composed of p-type a-Si layer 43, i-type a-Si layer 44 and n-type a-Si layer 45 and an aluminum electrode 47 laminated sequentially on a transparent electroconductive film 42 formed on a transparent insulating sheet 41. In the a-Si solar cell 48, light 49 incident on the transparent insulating sheet 41 is absorbed in the a-Si layer 46 thereby generating an electromotive force between the transparent electroconductive film 42 and the aluminum electrode 47, and the electric power thus generated is taken out through lead wires 50.

Small size types of such a-Si solar cells are already used as cells for table computers, watches and the like. In future, such cells are expected to be used for power generation, automobiles, ships, and the like by improving their photoelectric conversion, enlarging their sizes, and lowering their manufacturing costs. In particular, a solar cell for an automobile is expected to be provided in an automobile for use as an electric power supply to drive a ventilator when the automobile is parked or to drive other electronic equipment inside the automobile.

It is expected that a solar cell will be used in the above-mentioned fields. For a practical application, however, a solar cell having a curved surface is desired depending on its particular purpose. For example, an automobile body, is desired to have a curved shape in view of aerodynamic efficiency and design, and accordingly a solar cell mounted thereon is also required to have a curved surface fitted thereto.

Heretofore, it is known to use a bilayer glass having a solar cell of a flat plate-like small silicon wafer embedded between two glass plates, as a sunroof and the like. However, there has been a restriction such that the silicon wafer itself can not be subjected to a bending treatment, and it must be used in the state of a flat plate. It is also inferior from the viewpoint of manufacturing costs and productivity. From the viewpoint of the design, productivity and the like, it is desired that a solar cell itself has a curved surface shape.

It is conceivable to use a flexible plastic film as the transparent insulating sheet in order to make a curve-shaped solar cell, but the plastic film is generally inferior in weather-resistance. Furthermore, when it is used for an automobile in the state of being exposed to the atmosphere, it is weak in impact-resistance, scratch-resistance and the like. It is also not resistant to high temperatures at which an a-Si semiconductor film of a solar cell is formed. Thus, a plastic film has been generally unsuitable as the transparent insulating sheet for a solar cell.

As mentioned above, there have been attempts to use a solar cell as an electric power source for driving an air ventilator during parking or other electronic equipments of an automobile. For example, Japanese Unexamined Patent Publication No. 115719/1986 discloses a sunroof for an automobile having a solar cell mounted thereon. However, the solar cell used therein is not visible light-transmissive, but rather it is intended to impart a light-shielding property to the sunroof by using a light-shielding solar cell. Japanese Unexamined Patent Publication No. 199466/1988 discloses a light-transmissive solar cell, but there is no provision for a protective layer.

On the other hand, an automobile having a glass plate panelled sunroof window is popular as the glass-panelled sunroof gives an open-minded feeling to drivers and passengers. Accordingly, a solar cell mounted on the automobile and a protective layer therefor are required to be visible light-transmissive for this purpose. However, if the protective layer is light-transmissive, a grid electrode, a collective busbar and the like of the solar cell are visible from the inside of the automobile, thus spoiling the appearance. Moreover, there has been a problem that when a highly reflective metal such as Ag, Al, Cr and the like is used as a back electrode of the solar cell, drivers and passengers are dazzled by the glare from the highly reflective metal and their eyes are sometimes fatigued.

An object of the present invention is to provide a glass substrate for a solar cell having a curved surface shape, which is free from the above-mentioned problems, and to provide a solar cell-installed window glass panel, particularly a sunroof, for an automobile, having an excellent appearance and visible light-transmittance.

The present invention provides a glass substrate for a solar cell, comprising a glass sheet having a curved surface shape and a transparent electroconductive film formed on the concave surface side of said glass sheet.

The present invention also provides a method for producing a glass substrate for a solar cell having a curved surface shape, which comprises heating a glass sheet, forming a transparent electroconductive film on said glass sheet and then subjecting the resultant glass substrate to a bending treatment in such a manner as to make the transparent electroconductive film surface of the glass substrate in the shape of a concave surface.

Further, the present invention provides a solar cell-installed window glass panel for an automobile, comprising a transparent outer glass plate having a light-transmitting solar cell using amorphous silicon as a photoelectric conversion layer formed on the inner side of an automobile, and a transparent protective layer formed to cover said amorphous silicon solar cell on the inner side of the automobile.

Now, the present invention will be described in detail with reference to the preferred embodiments.

In the accompanying drawings:

FIG. 6 is a cross-sectional view illustrating another embodiment of the solar cell-installed window glass panel for an automobile in accordance with the present invention.

FIG. 7 is a planar outline view of an embodiment of the solar cell-installed window glass panel for an automobile in accordance with the present invention, as viewed from the outside or the inside of the automobile.

FIG. 13 shows a graph illustrating the deterioration in the power output of the solar cells embedded in the sunroofs of Example 5, Comparative Examples 2 and 3 after being naturally exposed to atmosphere.

FIGS. 1a to 1c are cross-sectional views illustrating various embodiments of the glass substrate for a solar cell having a curved surface shape in accordance with the present invention.

The glass sheet 1 used in the present invention is an insulating transparent sheet having a high light-transmittance, for example a transmittance of at least 85%, in the wavelength range of 350–800 nm, and having a high chemical and physical durability and good optical properties. For example, soda-lime silicate glass, aluminosilicate glass, borosilicate glass, lithium aluminosilicate glass, or various other types of glass may be employed.

The thickness of the glass sheet 1 is not particularly limited, but is suitably from 1.0 to 5.0 mm when various factors such as the ease of bending treatment, light transmittance, weight, strength, the convenience of handling, and the like are taken into consideration.

The curvature of a glass substrate for a solar cell having a curved surface shape of the present invention is not particularly limited, but if the glass substrate having a transparent electroconductive film is bent into a too small radius of curvature, it sometimes causes such strain as to deteriorate the transparent electrocondctive film, and it is difficult to uniformly form an a-Si film on the curved surface. Thus, a suitable radius of curvature (R) is not less than 80 mm, preferably not less than 500 mm.

Examples of a transparent electroconductive film 2 formed on a glass sheet 1 include highly electroconductive transparent metallic oxides such as tin oxide doped with fluorine in an amount of from 0.1 to 5% by weight, tin oxide doped with antimony in an amount of from 0.1 to 30% by weight, indium oxide doped with tin in an amount of from 0.5 to 30% by weight, and the like. Among them, a transparent electroconductive film comprising tin oxide doped with fluorine is most suitable as the transparent eletroconductive film for a solar cell sinceit easily provides a low sheet resistance of not higher than 10 $\Omega/\square$, and it has a high durability to a highly reductive hydrogen plasma used for the formation of a-Si by plasma CVD method. The thickness of the transparent electroconductive film is suitably from 300 to 10,000 $\mathring{A}$.

The transparent electroconductive film used in the present invention can be formed by various conventional methods such as CVD, spraying, sputtering, vacuum depositing, ion plating, dipping and the like. Among them, CVD and sputtering are most suitable since they produce a satisfactory uniform electroconductive film of resistance.

Figure 1A:
FIGS. 1a to 1c are cross-sectional views illustrating different embodiments of the glass substrate for a solar cell having a curved surface shape in accordance with the present invention.
Figure 1B:
Figure 1C:
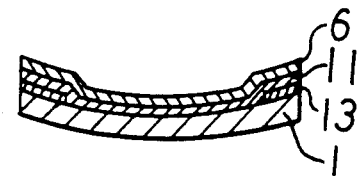

As seen from FIGS. 1a to 1c, the glass substrate for a solar cell having a curved surface of the present invention comprises a glass sheet 1 having a curved surface and a transparent electroconductive film 2 formed on the concave surface side of the glass sheet 1. If a flat plate like glass substrate having a transparent electroconductive film formed thereon is heated to a bending treatment temperature and the heated substrate is bent in such a manner as to make the transparent electrocondctive film surface concave, the transparent electroconductive film is liable to remarkable deterioration as it cracks and/or peels off from the glass sheet. Furthermore, in many practical cases, a solar cell is prepared by forming a photoelectric conversion layer on the concave surface of a glass substrate. Thus, it is preferable also for practical use to form a transparent electroconductive film on the concave surface side of a glass sheet. For example, as seen from FIG. 2, the desired solar cell for a sunroof of an automobile comprises a glass sheet 21, the convex side of which is exposed to the atmosphere, a transparent electroconductive film 22 formed on the concave side of the glass sheet 21, i.e. on the inner side of the automobile, an a-Si semiconductor layer 25 formed on the transparent electroconductive film 22, and a back electrode 26 formed on the a-Si semiconductor layer 25.

When the glass sheet 1 comprises an alkali metal-containing glass such as soda lime silicate glass or the like, as shown in FIGS. 1b and 1c, an alkali barrier coating 11 may be optionally applied on the glass sheet 1 in order to prevent the transparent electroconductive film 6 from being adversely affected by alkali eluted from the surface of the glass sheet 1. Examples of the alkali barrier coating 11 include silicon oxide film, aluminum oxide film and zirconium oxide film, and the thickness of the alkali barrier coating is suitably from 500 to 800 Å.

As seen from FIG. 1c, a light-shielding colored layer 13 may be formed beneath the transparent electroconductive film 6 and the alkali barrier coating 11, along the peripheral margin of the glass substrate for a solar cell having a curved surface shape of the present invention in order to shield a current collective busbar usually formed along the peripheral margin so that the busbar can be concealed from one's eyes, thus improving external appearance. The light-shielding colored layer 13 is not particularly limited, but it is generally a ceramic color ink comprising a pigment to generate a desired color, a low melting glass frit to form a paint film intimately adhered with the glass sheet, various refractory fillers, oil for screen-printing, and the like. It is preferable that the ceramic color ink does not deteriorate during forming the alkali barrier coating 11 or the transparent electoconductive film 6 thereon, and that it does not adversely affect the upper layer formed in contact therewith.

A suitable method for preparing a glass substrate for a solar cell having a curved surface shape as shown in FIG. 1c, comprises screen-printing a ceramic color ink 13 on a glass sheet 1 along the peripheral margin, drying the printed glass sheet 1, forming an alkali barrier coating 11 on the dried glass sheet 1 in an alkali barrier coating zone of a CVD furnace, forming a transparent electroconductive film 6 on the alkali barrier coating in a transparent electroconductive film forming zone of the CVD furnace, and finally subjecting the glass substrate thus prepared to a bending treatment.

In the present invention, the glass substrate for a solar cell having a transparent electroconductive film is subjected to a bending treatment. Examples of bending methods used for this treatment generally include a press-bending method which comprises press-bending a glass substrate heated to a bending temperature by a press mold (e.g. the bending temperature of soda lime silicate glass is from 570 to 700° C.); a gravity-bending method using the self-weight of a glass substrate in bending; an air forming method which comprises having a glass substrate adsorbed and bent by an adsorbing mold; and a blow-bending method using a gas blow.

The glass substrate thus bent may be subjected to a strengthening treatment. The strengthening treatment can be effected by blowing quenching air to the bent glass substrate in the quenching step after the bending treatment, thereby quench-strengthening the bent glass substrate. Another way of strengthening the bended glass sheet is a chemical strengthening method by ion exchange.

In the preparation of the glass substrate for a solar cell in accordance with the present invention, the bending treatment may be carried out any time before or after forming the transparent electroconductive film on a glass sheet. However, when it is difficult to uniformly form the transparent electroconductive film on the bent glass sheet (for example when the film formation is effected by the CVD method), it is preferable to carry out the bending treatment after forming the transparent electroconductive film on a flat plate-like glass sheet. Also, when it is necessary for the formation of a transparent electroconductive film to heat the glass sheet to such a high temperature as to substantially deform the glass sheet (for example when the film is formed by CVD method), it is preferable to effect the bending treatment after the formation of the film. The accuracy of the bending deteriorates and the desired curved surface shape can not be obtained if the bent glass sheet is heated to a high temperature for the formation of the film.

Great care must be taken to heat the glass substrate for bending after the formation of the substrate is heated to an excessively high temperature, the transparent electroconductive film is likely to be impaired due to the thermal expansion difference with glass oxidation, or other factors, thereby resulting in an increase in the resistance value and degradation of light-transmittance.

Figure 3:
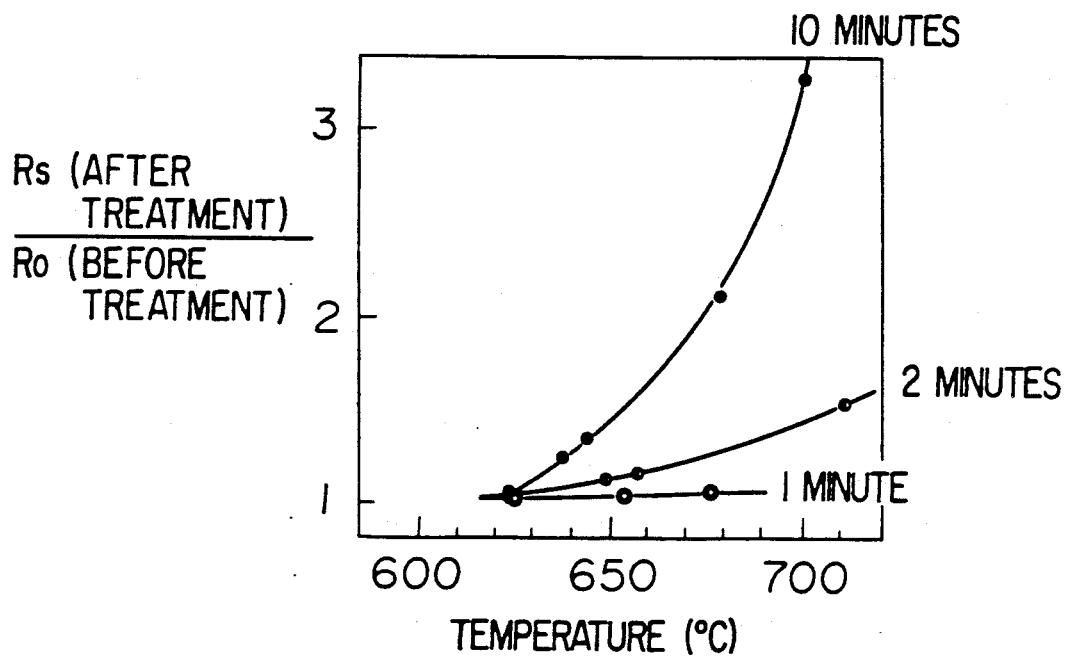
FIG. 3 shows a graph illustrating the increasing rate of resistance in relation to the heating temperature and time with regard to a glass substrate having a transparent electroconductive film.
Figure 4:
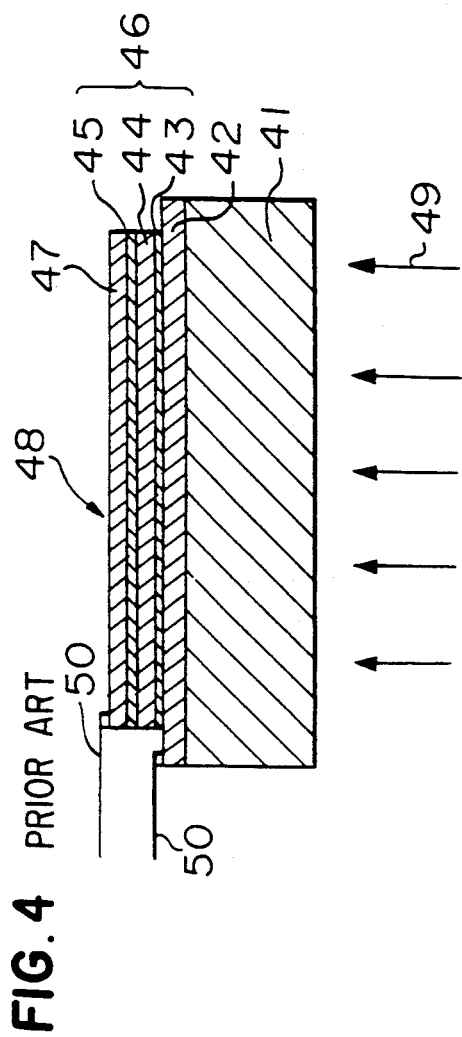
FIG. 4 is a cross-sectional view illustrating a conventional amorphous silicon solar cell.

We have carried out an experiment to determine preferable conditions for bending the glass substrate having a transparent electroconductive film, and obtained the results as shown in FIG. 3. That is, FIG. 3 is a graph showing a relation between the increasing ratio of resistance value Rs/Ro (Ro shows the resistance values of the transparent electroconductive film before heating, and Rs shows those after heating) and the heating temperature and heating time when a glass substrate having a fluorine-doped tin oxide film is heated in a heating furnace in the atmosphere of air. As can be seen from these results, if the heating temperature is set not higher than 650° C. and the heating time is set not longer than 2 minutes, the increase in resistance of the transparent electroconductive film can be controlled to a minimum. Thus, these heating conditions are most preferable for bending the glass substrate having the transparent electroconductive film of the present invention.

That is, the most suitable method for producing a bent-treated glass substrate for a solar cell comprises heating a glass sheet at from 500 to 600° C., coating a transparent electroconductive film on one side of the glass sheet by CVD method, and bending the formed glass substrate at a bending temperature of from 580 to 650° C. According to this method, a glass substrate having stable performance can be produced at a high mass-productivity and at a low cost. Furthermore, when a strengthening treatment step is added to this method, a glass substrate produced thereby is durable to external impacts when exposed to the outside atmosphere, and is not damaged by hail, small stones, and the like. This strengthening treatment can be effected by a quench-strengthening method which comprises blowing cooling air during the cooling step after the bending treatment, or other methods including a chemical strengthening method using ion-exchange.

The solar cell having a curved surface shape using the glass substrate of the present invention is suitable for use where a good design is required, and is particularly suitable for use in a sunroof of an automobile.

Figure 2:
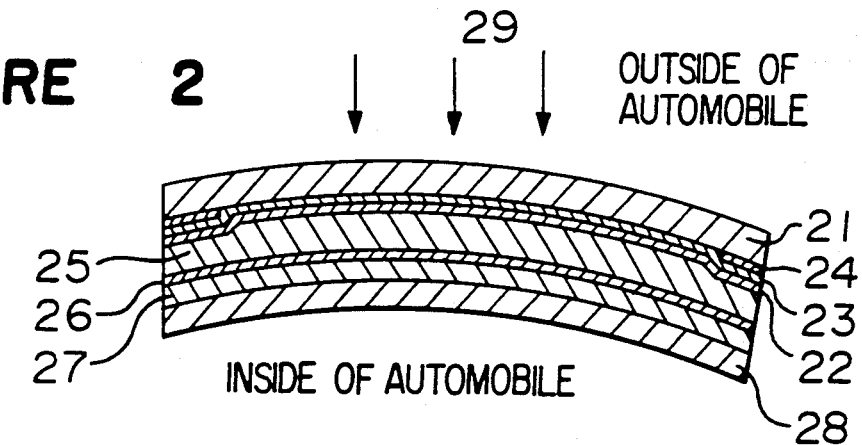
FIG. 2 is a cross-sectional view illustrating an outline of a solar cell for a sunroof having a curved surface shape, wherein the glass substrate of the present invention is employed.

FIG. 2 shows an embodiment of the solar cell using the glass substrate of the present invention to be mounted in a sunroof of an automobile. That is, the solar cell shown in FIG. 2 comprises a curved glass sheet 21 having a ceramic colored ink layer 24 on the concave surface along the peripheral margin, an alkali-barrier coating 23 formed thereon, a transparent electroconductive film 22, an amorphous silicon photoelectric conversion layer 25, and a back electrode 26 formed thereon. The solar cell is then laminated with a glass plate 28 having substantially the same curved surface as that of the glass sheet 21 with an interlayer 27 interposed therebetween. Light 29 incident on the glass sheet 21 of the solar cell thus prepared is absorbed in the a-Si layer 25, thereby generating an electromotive force between the transparent electroconductive film 23 and the back electrode 26, and the electromotive force thus generated is taken out by lead wire or other means (not shown in FIG. 2).

As mentioned above, the present invention provides a glass substrate having a transparent electroconductive film suitable for a solar cell having a curved surface shape, which is superior in weather-resistance and crack-resistance to a solar cell using a plastic film as a substrate, and it is thereby possible to produce solar cells of various curved surface shapes.

According to the method for producing a glass substrate of the present invention, a curve-shape glass substrate having a transparent electroconductive film T good quality can be produced at a low cost by forming the transparent electroconductive film on a glass sheet and then subjecting the resultant glass substrate to a bending treatment without substantially deteriorating the transparent electroconductive film.

The solar cell for a sunroof of the present invention has advantages of good aerodynamics an automobile body, efficiently utilizing light incident on the sunroof, and also having a good design.

Another preferred embodiment of the present invention is explained hereinafter in accordance with the attached drawings. A solar cell-installed window glass panel of the present invention comprises an outer glass plate 1, a light-transmissive solar cell 2 formed on the outer glass plate 1 on the inner side of an automobile, and a transparent protective layer 3 formed on the solar cell 2 on the inner side of an automobile. The protective layer 3 is made of a material having a penetration resistance, which controls the transmission of visible light.

Figure 5:
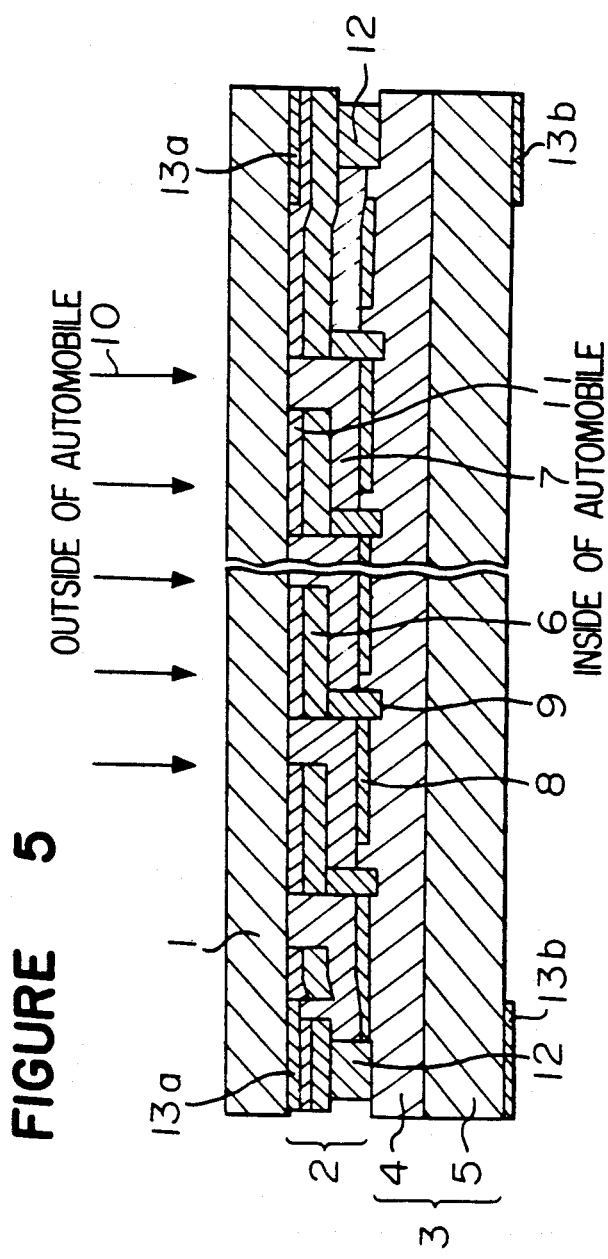
FIG. 5 is a cross-sectional view illustrating an embodiment of the solar cell-installed window glass panel for an automobile in accordance with the present invention.

FIG. 5 shows a typical embodiment of the present invention. Said protective layer 3 is composed of a transparent interlayer 4 and a transparent inner glass plate 5, and the inner plate 5 is laminated with the light-transmissive solar cell 2 with the interlayer 4 interposed therebetween. At least one of the interlayer 4 and the inner glass plate 5 used as a protective layer is colored. It is preferable that the interlayer 4 is colored and that the visible light-transmittance is from 5 to 60%. If the visible light-transmittance of the colored interlayer is less than 5%, the total visible light-transmittance of the window glass panel is greatly reduced, and drivers or passengers can not fully enjoy an open-minded feeling. On the other hand, if the visible light-transmittance of the colored interlayer is higher than 60%, it is difficult to reduce the glare from the back electrode and/or grid electrode of a solar cell. The color of the colored transparent interlayer 4 can be optionally selected. For example, bronze, blue, grey or green may be mentioned. The material of the interlayer 4 is preferably polyvinyl butyral, ethylene vinyl acetate or urethane, which is commonly used for a laminted glass of an automobile. The thickness of the interlayer 4 is preferably from 0.3 to 0.8 mm.

Among them, polyvinyl butyral is preferable, since it has satisfactory penetration-resistance and good adhesive property with glass. However, polyvinyl butyral has a water content of about 0.5% by weight. Therefore the performance of a solar cell is liable to be deteriorated by water freed from polyvinyl butyral when polyviny butyral is placed in direct contact with an amorphous silicon photoelectric conversion area.

On the other hand, the water content of ethylene-vinyl acetate is adequately low, but the penetration-resistance is a little poor as compared with that of polyvinyl butyral.

Accordingly, a double-layered interlayer prepared by laminating the two materials has both advantages of the two. FIG. 6 is a partially sectional view illustrating an embodiment of the solar cell using a double-layered interlayer composed of two layers 4a and 4b. In this embodiment, at least one of the first interlayer 4a, the second interlayer 4b and an inner glass plate 5, which form a protective layer 3, is colored. Preferably, either interlayer 4a or 4b is colored, and the visible light-transmittance of the colored interlayer is preferably from 5 to 60%. If the visible light-transmittance of the colored interlayer is less than 5%, drivers and passengers can not fully enjoy an open-minded feeling and therefore an object of the present invention can not be achieved. On the other hand, if the visible light-transmittance of the colored interlayer is higher than 60%, it is difficult to reduce the glare from the back electrode and/or grid electrode of the solar cell. The color of the colored transparent interlayer 4a and/or 4b can be optionally selected, including bronze, blue, grey and green.

The material of the second interlayer 4b is preferably polyvinyl butyral or urethane, which is commonly used for a laminated glass of an automobile and the thickness of the interlayer 4b is preferably from 0.2 to 0.8 mm.

On the other hand, the material of the first interlayer 4a in direct contact with the solar cell should preferably have a moisture-permeability coefficient of not higher than 20 (g/hr/cm$^2$/cm). A preferable example is ethylene-vinyl acetate (EVA). Ethylene-vinyl acetate is preferable in view of its transparency and adhesive property with the back electrode 8 of the solar cell 2. Ethylene-vinyl acetate having a thickness of larger than 0.05mm satisfactorily shields a solar cell from moisture. From a practical view point, the thickness of ethylene-vinyl acetate is preferably from about 0.2 to 0.4 mm, which is easy to handle.

In the embodiments as shown in FIGS. 5 and 6, when a colored transparent inner glass plate 5 is used, it is favorable to use a thermal ray-absorbing glass prepared by adding a minor amount of a metal oxide or metal such as iron, nickel, cobalt or selenium. It is also favorable to use a thermal ray-refective glass with its surface in contact with the second interlayer being treated. The color of the inner glass plate 5 is influenced by the type of metal or metal oxide to be added and the type of surface treatment to be applied, blue, grey and green. The visible light-transmittance of the transparent inner glass plate 5 should also be preferably from 5 to 60%.

The transparent protective layer 3 used in the present invention may be composed of one or more plastic layers. For example, polyethylene terephthalate (PET) having a sufficient durability is preferably used. Furthermore, a urethane type plastic film having a self-healing properting can also be used. When the protective layer is composed of a plastic type film only, a window glass panel for an automobile having a light weight and an anti-lacerative property to the human body can be provided.

The light-transmissive solar cell 2 formed on an outer glass plate 1 on the inner side of an automobile in accordance with the present invention is not particularly limited. As shown in FIGS. 5 and 6, it is generally composed of a light-incident side transparent electrode 6 made of a transparent electroconductive film comprising fluorine-containing tin oxide, tin containing indium oxide or the like as the main component; a p-, i-, n-type amorphous silicon layer 7 as a photoelectric conversion area; and a transparent back electrode 8 made of a metal oxide, a metal such as Ag, Al and Cr, or a laminted layer of the two. The thickness of the p-, i-, n-type amorphous silicon layer used for the transparent solar cell-installed window glass panel may be from 2,000 to 5,000 Å. Reference numeral 9 in the Figures represents a grid electrode made of e.g. Ag which connects a light-incident side electrode 6 with, the corresponding back electrode 8 of the respective adjacent solar cell. Numeral 12 represents a pair of current collective electrodes to output electromotive force generated in the solar cell. When an alkali metal-containing glass is used as the outer glass plate 1, an alkali barrier film 11 such as a film comprising silicon dioxide or aluminum oxide as the main component, may be formed between the outer glass plate 11 and the light-incident side electrode 6 in order to protect the light-incident side electrode 6 from being damaged by the alkali component, thereby preventing the electroconductivity of the electrode 6 from lowering.

The window glass panel of the present invention comprises a light-transmissive solar cell 2 formed on a transparent outer glass plate 1 on the inner side of an automobile and a transparent protective layer 3 formed on the solar cell 2 on the inner side of the automobile, the protective layer 3 being composed of an interlayer 4 and an inner glass plate 5, at least one of which is colored, whereby the glare from the back electrode of the solar cell 2 in the inside of an automobile can be reduced by the colored protective layer.

Furthermore, as shown in FIG. 6, when the interlayer 4 is composed of two layers, and the interlayer 4a in direct contact with the solar cell 2 is made of ethylene-vinyl acetate having less water content and less moisture permeability, the electric properties of the solar cell 2 are not deteriorated by water, thereby providing a solar cell having a good penetration resistance, the electric properties of which are stable for a long period of time.

The total visible light-transmittance of the solar cell-installed window glass panel for an automobile using the above-mentioned colored transparent protective layer in accordance with the present invention should be controlled preferably 20% or less, thereby removing the glare as viewed from the inside of the automobile. The open-minded feeling in the inside of the automobile can be assured if the visible light-transmittance is at least a few percents, e.g. 5% or more.

As shown in FIGS. 5 and 6, in a window glass panel comprising a solar cell 2 having a current collective electrode 12 along the peripheral margin formed on a transparent outer glass plate 1 and a transparent-protective layer 3 formed on the solar cell 2, the current collective electrode 12 is visible from both the inside and the outside of the automobile. It is therefore preferable for aesthetically pleasing external appearance to conceal the collective electrode. For example, as shown in FIG. 7, it is preferable to form a light-shielding colored layer 13 along the entire peripheral margin of the window glass panel in such a manner as to conceal the current collective electrode 12. FIGS. 5 and 6 illustrate the cross sections taken along the line A—A in FIG. 7.

The light-shielding colored layer 13 is not particularly limited, but it is generally a ceramic color ink, as shown in FIG. 1c and FIG. 2, which comprises a pigment to give a desired color, a low melting glass frit to form a paint film intimately adhered with the glass sheet, various refractor fillers and oil for screen-printing. It is preferable that the ceramic color ink does not deteriorate during forming an alkali barrier coating 11 or a light-incident side electrode 6 thereon. Further, it should not adversely affect the upper layer to be formed in contact therewith.

FIGS. 5 and 6 illustrate embodiments wherein light-shielding colored layers 13a and 13b are formed on an outer glass plate 1 on the inside of an automobile and on an inner glass plate 5 on the inside of an automobile, respectively, but they may be formed on the outer glass plate 1 and on the inner glass plate 5 both on the outside of the automobile. However, it is generally preferred to form the light-shielding colored layer 13a on the outer glass plate 1 along the peripheral margin not on the outside of an automobile but on the inside of an automobile as shown in FIGS. 5 and 6 in view of weather-resistance and external appearance.

With regard to the inner glass plate 5, a light-shielding colored layer may be formed on either the inside or the outside of an automobile. FIGS. 5 and 6 illustrate the cases wherein the light-shielding colored layer 13b is formed on the inner glass plate 5 along the peripheral margin on the inside of an automobile. In the preparation of a solar cell having a curved surface shape, the glass substrate having a curved surface shape or the solar cell is prepared by firstly forming a light-shielding colored layer 13a on a flat outer glass plate along the peripheral margin, forming thereon a light-incident side electrode 6, a collective electrode 12 and a grid electrode 9, placing the resultant outer lass plate in such as manner as to make the light-incident side electrode 6, etc. upward, placing thereon a flat inner glass plate having a light-shielding colored layer 13b along the peripheral margin, heating the outer glass plate and the inner glass plate thus placed to overlap each other, and finally bending the resultant sandwiched stracture by a self-weight bending method in such a manner as to make the surface of the light-incident electrode side of the outer glass plate into the shape of a concave surface. In such a preparation step as mentioned above, when a light-shielding colored layer is formed on the inner glass plate on the outside of an automobile, the light-shielding colored layer formed on the inner glass plate along the peripheral margin is heated in the state of being in contact with the outer glass plate in the bending step. Therefore, there is a fear that the light-shielding colored layer is melted and fused to deposit on the outer glass plate located thereunder. It is therefore preferable to form the light-shielding colored layer 13b on the inner glass plate on the inside of an automobile when the bending step is carried out by the above-mentioned method. When an outer glass plate and an inner glass plate are individually bended, a light-shielding colored layer be formed on the inner glass plate on either the inside or the outside of an automobile. When a light-shielding colored layer is required to be formed in a large thickness, it is preferable to form the light-shielding colored layer on the inner glass plate on the inside of an automobile. Otherwise, the outer glass plate having the thick light-shielding colored layer formed on the inside of an automobile and the inner glass plate having the thick light-shielding colored layer formed on the outside of the automobile are not satisfactorily laminated with an interlayer 4 located therebetween.

The light-shielding colored layer 13 has another merit of concealing a dirty part produced when an interlayer constituting a window glass panel is deteriorated along the peripheral margin by reaction with water, thereby spoiling external appearance.

A method for producing a glass substrate having such a curved surface suitable for a solar cell-installed window glass panel, comprises firstly washing a flat outer glass plate 1; forming a light-shielding colored layer 13, for example ceramic color ink, on the washed outer glass plate along the peripheral margin by printing and baking; forming an alkali barrier coating 11 and a light-incident side electrode 6 thereon; forming a grid electrode 9 and a current collective electrode 12 made of e.g. Ag paste by screen-printing to have appropriate patterns at appropriate locations and baking them; placing a flat inner glass plate 5 having a light-shielding colored layer printed and baked along the peripheral margin on the above treated outer glass plate to overlap each other; and finally bending the sandwiched structure in such a manner as to make the surface of the light-incident electrode side of the outer glass plate into the shape of a concave surface. The final bending treatment is effected preferably by a self-weight bending method so as not to deteriorate the light-incident side electrode 6, etc, after placing the inner glass plate on the light-incident side electrode 6, etc. of the outer glass plate.

Thereafter, the inner glass plate is separated from the outer glass plate, and a photoelectric conversion layer 7 and a back electrode 8 are formed on the light-incident side electrode on the outer glass plate. The outer glass plate thus treated is then laminated with the inner glass plate preferably by interposing an interlayer 4 therebetween.

Figure 8:
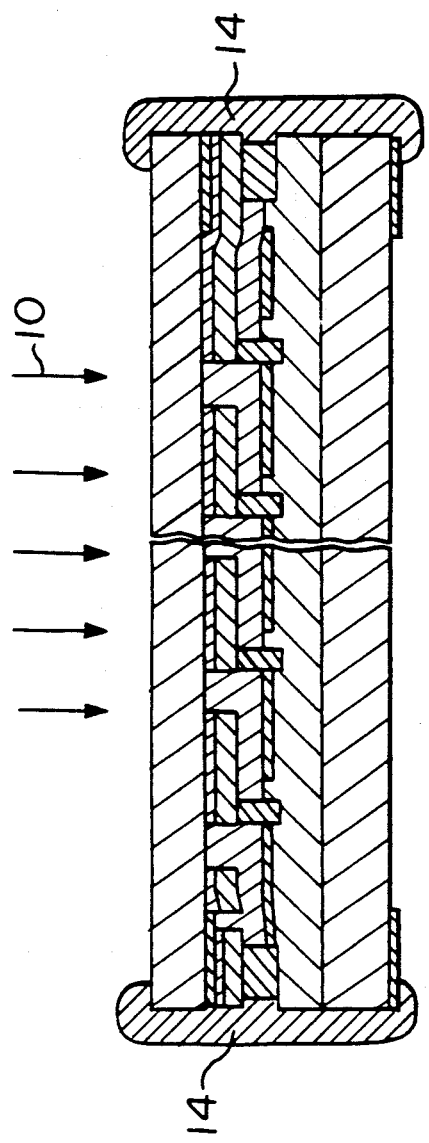
FIG. 8 is a cross-sectional view illustrating an embodiment of the solar cell-installed window glass panel for an automobile, sealed along the peripheral margin, in accordance with the present invention.

A solar cell-installed window glass panel laminated by interposing an interlayer therebetween as shown in FIGS. 2, 5 and 6 is preferably sealed along its peripheral margin in order to protect the peripheral margin from being damaged by water, thereby preventing the lowering of the performance of the solar cell and also preventing Ag in the grid electrode 9 and the current collective electrode 12 from whitening. FIG. 8 is cross sectional view illustrating an embodiment, wherein the peripheral margin of the solar cell-installed window glass panel as shown in FIG. 5 is sealed.

A sealing material 14 to seal the peripheral margin should preferably have a moisture-permeability coefficient of less than 20 (g/hr/cm$^2$/cm) in order to achieve satisfactory sealing effect. Preferable examples of the sealing material include butyl rubber (moisture-permeability coefficient =0.1 to 0.5), fluorine type resin (moisture permeability coefficient =0.1 to 0.5), EVA (moisture-permeability coefficient =2 to 3), epoxy resin moisture-permeability coefficient =4 to 6) and vinyl chloride type resin (moisture-permeability coefficient =15).

The shape of the sealing material is not particularly limited, but the sealing material may have a shape suitable for fixing a solar cell-installed window glass panel on an automobile body and it may work not only for sealing but also as a molding.

As mentioned above, the damage by water at the peripheral margin of the glass panel can be prevented by sealing the peripheral margin with a sealing material having a low moisture-permeability coefficient, thereby preventing the lowering of the performance of a solar cell caused by reaction of water with the a-Si layer 7 constituting the photoelectric convertion area of a solar cell, with the grid electrode 9, or with the current collective electrode 12, and also preventing the whitening of Ag which is the main component of the grid electrode 9 or collective electrode 12.

Figure 9A:
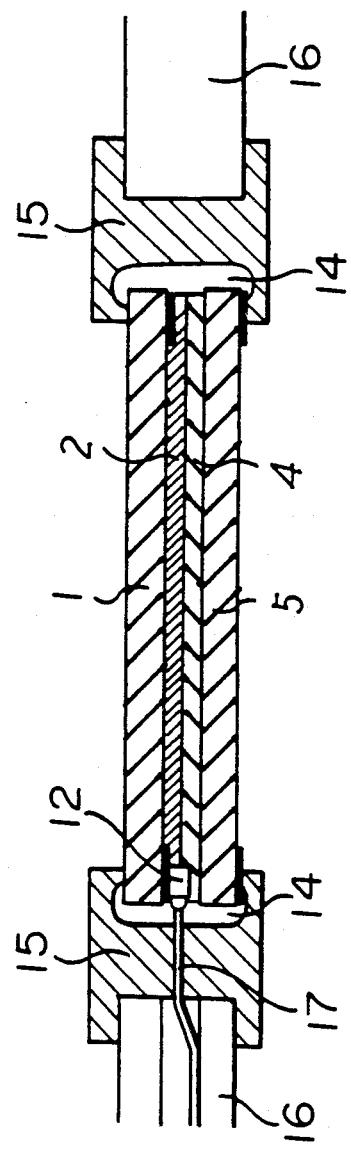
FIGS. 9a to 9d are cross-sectional views illustrating different embodiments of the solar cell-installed window glass panel having a gasket integrally molded along the peripheral margin, thereby being fixed to an automobile body, in accordance with the present invention.

As shown in FIG. 9a, a synthetic resin can be molded into a desired shape along the peripheral margin of a solar cell-installed window glass panel of the present invention by an extrusion molding, injection molding, transfer molding, RIM (reaction injection molding) or LIM (liquid injection molding) method, so that the window glass panel can be easily mounted on an automobile body 16, and in such a case a decorative molding and a gasket 15 can be integrally molded.

The type of the synthetic resin used for this purpose is not particularly limited if it is molded and solidified by the above-mentioned various molding methods. However, it is preferable for productivity and manufacturing cost to mold a molding or gasket made of polyurethane by RIM method from a polyol and an isocyanate compound or to mold a molding or gasket from a vinyl chloride type resin by injection molding method.

In addition to the above-mentioned synthetic resins, thermoplastic resins or thermoplastic rubbers such as an ethylene-vinyl acetate copolymer (EVA), butyl rubber or polyvinyl chloride, thermosetting resins such as epoxy resin, and fluorine resin, may also be used.

As shown in FIG. 9a, the molding or gasket 15 is molded preferably so as to cover the sealing material 14 sealing the peripheral margin. When a synthetic resin having a sufficiently small moisture-permeability coefficient such as EVA, butyl rubber, fluorine resin or epoxy resin is used for molding a molding or gasket, the molding or gasket may be molded directly along the peripheral margin of a solar cell-installed window glass panel so as to serve also as the sealing material 14.

Generally, a gasket is regarded as intended for sealing a window glass panel fixed to an automobile body, and a molding is regarded as intended for decoration. However, for the purpose of the present invention, the terms "gasket" and "molding" are not particularly discriminated and are used with substantially the same meaning.

A gasket 15 made of a resin should preferably have such a shape as to be easily mounted on an automobile body 16. The gasket 15 may be integrally molded, together with a mounting element to the automobile body 16, for example, with a part of a retainer embedded in the gasket.

Figure 9B:
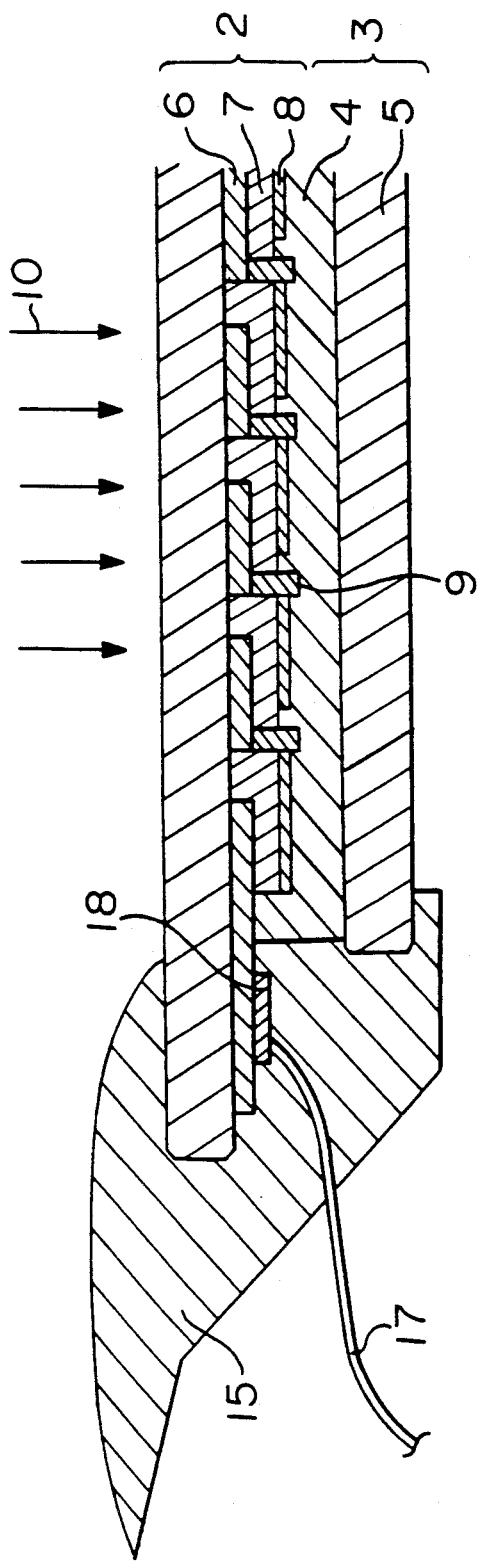

As shown in FIG. 9a, a lead wire 17 to output electric power from a pair of collective electrodes 12 may also be integrally embedded, thereby providing a good external appearance and protecting the contact point between the current collective electrode 12 and the lead wire 17 from being attacked by water, chemicals, etc. In this manner, the collection of electric power can be effected without being adversely affected by external physical factors including tensile force, impact force or the like. Further, as shown in FIG. 9b, a terminal 18 and a lead wire 17 for taking out electric power from a solar cell may also be integrally embedded by molding.

Figure 9C:
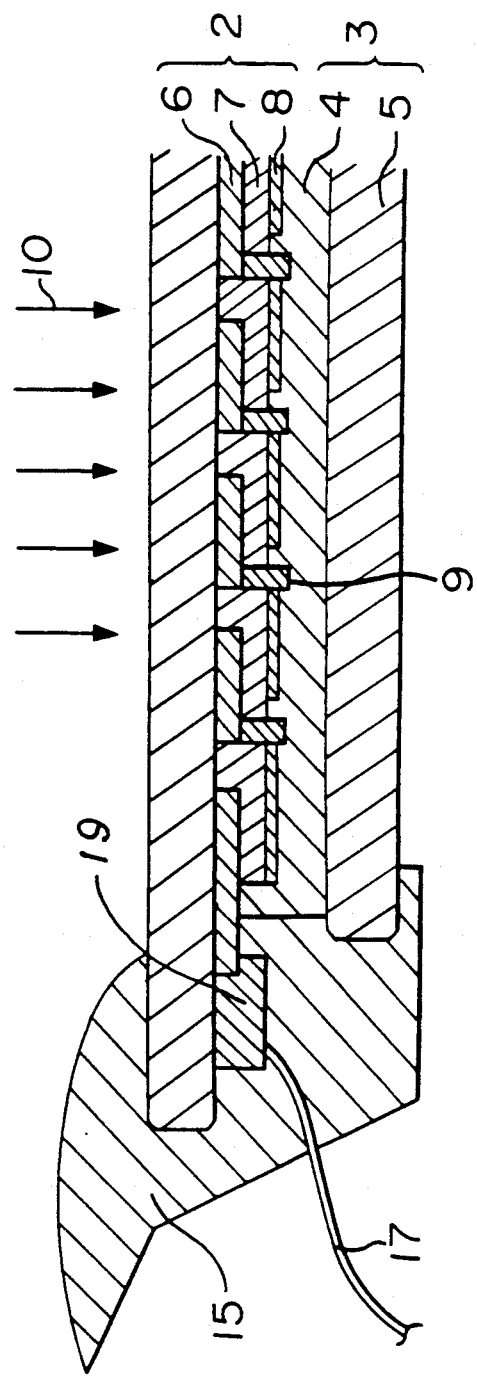

Still further, as shown in FIG. 9c, external circuits 19, including a diode for preventing reverse current, a circuit for stabilizing electric voltage, a circuit for stabilizing electric current and other circuits necessary for an automobile, may also be embedded by molding. In this manner, these external circuits can be placed without spoiling the external appearance, and can be stabilized for a long period of time, thus being protected from external impact force, water chemicals and the like.

Figure 9D:
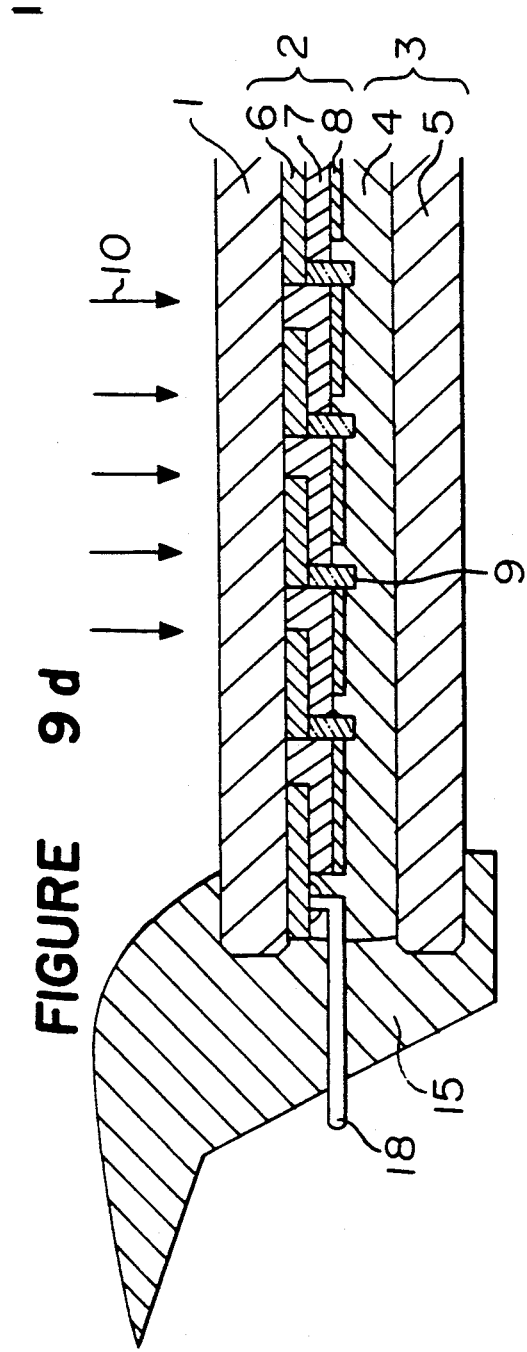

FIG. 9d illustrates still another preferable embodiment of the present invention. When a gasket material is integrally molded into a cavity space along the peripheral margin of a window glass panel by RIM injection molding or the like, it is sometimes difficult to fix flexible elements such as a lead wire or the like in a desired location. In such a case, it is convenient to use, instead of the flexible element, a metallic element having a fixed shape to take out electric power from a solar cell. FIG. 9d illustrates an embodiment wherein a fixed terminal 18 electrically connected with a light-incident side electrode 6 is provided in place of the flexible lead wire, so that it protrudes out from a gasket 15 and a lead wire may be electrically connected to the protruded portion of the fixed terminal 18.

When various circuits including a circuit for preventing reverse current are embedded as shown in FIG. 9c, the circuits may be preferably connected with the fixed terminal to output electric power.

The present invention will be described in further detail with reference to the following Examples. However, it should be understood that the present invention is by no means restricted to such specific Examples.

EXAMPLE 1

A soda lime silicate glass sheet of 870 × 285 × 2 (mm) was thoroughly washed, dried and thereafter placed in a CVD furnace of belt conveyor type. SiH$_4$ gas and O$_2$ gas were then introduced into the CVD furnace, in an SiH$_4$:O$_2$ ratio of about 1:10, and a silicon oxide film (700 Å) was formed by a CVD method at a glass sheet surface temperature of about 450° C. as an alkali barrier coating. After heating the glass sheet at 580° C., a gaseous mixture of tin tetrachloride in an amount of 1 × 10$^{-2}$ l/min., water vapor (10 times the amount of the tin tetrachloride), methyl alcohol (0.5 times the amount of the tin tetrachloride), hydrofluoric acid (0.5 times the amount of the tin tetrachloride) and nitrogen (250 times the amount of the tin tetrachloride), was blown onto the silicon oxide film on the glass sheet, thereby forming a transparent electroconductive film (6,000 Å) comprising tin oxide containing 1.0% by weight of fluorine by CVD method. The conveying speed of the glass sheet in the alkali barrier coating and tin oxide film coating zone was 0.60 m/min. The resultant transparent electroconductive film-coated glass sheet (hereinafter referred to as "TCO substrate") had a surface resistance of 8.0 Ω/□. Thereafter, the TCO substrate thus obtained was placed on a frame having a desired curved surface shape for self-weight bending by gravity, so that the tin oxide film is located above, and the substrate was heated to 590° C. The self-weight bending was then effected to make the tin oxide side surface concave. Various properties of the TCO substrate having the curved surface shape thus obtained are shown in Table 1. In Table 1, the transmittance*$^1$ was measured by an integrating-sphere photometer using C Light Source (JIS Z8720) as a light source. Bending A*$^2$ shows the maximum displacement of the longer edge, and Bending B*$^2$ shows the maximum displacement of the shorter edge. Thus, the TCO substrate having the desired curved surface was obtained, with its physical properties substantially unchanged before and after bending.

EXAMPLE 2

A soda lime silicate glass sheet of 1013 × 445 × 3 (mm) was thoroughly washed, and placed in the same CVD furnace as used in Example 1. A silicon oxide film (700 Å) and a transparent conductive film (7,000 Å) of tin oxide containing 1.0% by weight of fluorine were then formed on the glass sheet by the CVD method in the same manner as in Example 1, except that the conveying speed of the glass sheet was changed to 0.45 m/min. The TCO substrate thus obtained had a surface resistance of 6.0 Ω/□. The TCO substrate was then suspended by suspender, and heated to 630° C. The heated TCO substrate was then press-bended to make the tin oxide side surface concave, and the press-bended TCO substrate was subjected to a strengthening treatment by air cooling. Various properties of the TCO substrate having the curved surface shape thus obtained are shown in Table 1. Thus, the TCO substrate having the desired curved surface was obtained, with its physical properties substantially unchanged before and after bending. Also, the TCO substrate had a surface compressive stress of 400 kgf/cm$^2$.

TABLE 1

|  |  | Example 1 | Example 2 |
|---|---|---|---|
| Before bending | Surface resistance (Ω/□) | 8.0 | 6.0 |
|  | Transmittance*$^1$ (%) | 80 | 79 |
| After bending | Surface resistance (Ω/□) | 8.1 | 6.3 |
|  | Transmittance*$^1$ (%) | 80 | 79 |
|  | Bending A*$^2$ (mm) | 19 | 31 |
|  | Bending B*$^2$ (mm) | 5 | 8.5 |
|  | External appearance | No change | No change |

*$^1$The transmittance was measured by an integrating-sphere photometor using C Light Source (JIS Z8720).
*$^2$The Bending A shows the maximum displacement of the longer edge, and the Bending B shows the maximum displacement of the shorter edge.

EXAMPLE 3

A window glass panel for a sunroof of an automobile was prepared by laminating an outer glass plate 1 of transparent float glass (thickness=2.0 mm, visible light transmitance, T$_v$=7.5%) having a transparent solar cell 2 comprising a fluorine-containing tin oxide film (6,000 Å), p-type amorphous SiC layer (100 Å), i-type amorphous silicon layer (3,000 Å), n-type amorphous silicon layer (300 Å) and an Ag back electrode (400 Å) formed thereon on the inside of an autombile, and an inner glass plate 5 of transparent float glass (thickness =2.0 mm) with an interlayer 4 (thickness=0.75 mm, T=55%) of bronze-colored polyvinyl butyral interposed between the outer and the inner glass plates. The optical properties of the window, glass panel are shown in Table 2 together with those of Comparative Example 1.

EXAMPLE 4

A window glass panel for a sunroof of an automobile was prepared by laminating an outer glass plate of transparent float glass (thickness=2.0 mm, T$_v$=7.5%) having a transparent solar cell 2 comprising a fluorine-containing tin oxide film (6,000 Å), p-type amorphous SiC layer (100 Å), i-type amorphous silicon layer (3,000 Å), n-type amorphous silicon layer (300 Å) and an Ag back electrode (400 Å) formed thereon on the inside of an automobile, and an inner glass plate 5 of transparent float glass (thickness =2.0 mm), with a double-layered interlayer comprising the first interlayer 4a of ethylene-vinyl acetate (thickness=0.4 mm, T$_v$=90%) and the second interlayer 4b of bronze-colored polyvinyl butyral (thickness=0.37 mm, T$_v$=55%) interposed between the outer and the inner glass plates. The optical properties of the window glass panel are shown in Table 2, together with those of Comparative Example 1. The initial value of the maximum output power (Pmax) of the solar cell embedded in this sunroof is defined as 1, and the lowering of the maximum output power with the passage of time when exposed to the atmosphere is expressed by Line A in FIG. 10.

COMPARATIVE EXAMPLE 1

A window glass panel for a sunroof of an automobile was prepared in the same manner as in Example 3, except that non-colored polyvinyl butyral (thickness=0.75 mm, $T_v=90\%$) was used as the interlayer 4. The optical properties of this comparative window glass panel are shown in Table 2. The initial value of the maximum output power (Pmax) of the solar cell embedded in this comparative sunroof is defined as 1, and the lowering of the maximum output power with the passage of time when exposed to the atmosphere is expressed by Line B in FIG. 10.

TABLE 2

|  | Example 3 | Example 4 | Comparative Example 1 |
|---|---|---|---|
| Visible light-transmittance (%) | 4.2 | 3.7 | 6.7 |
| Reflectance in the inside of automobile (%) | 5.7 | 5.9 | 23.4 |
| Glare in the inside of automobile | Nil | Nil | Much |
| Concealment of grid electrode | Good | Good | No good |

Figure 10:
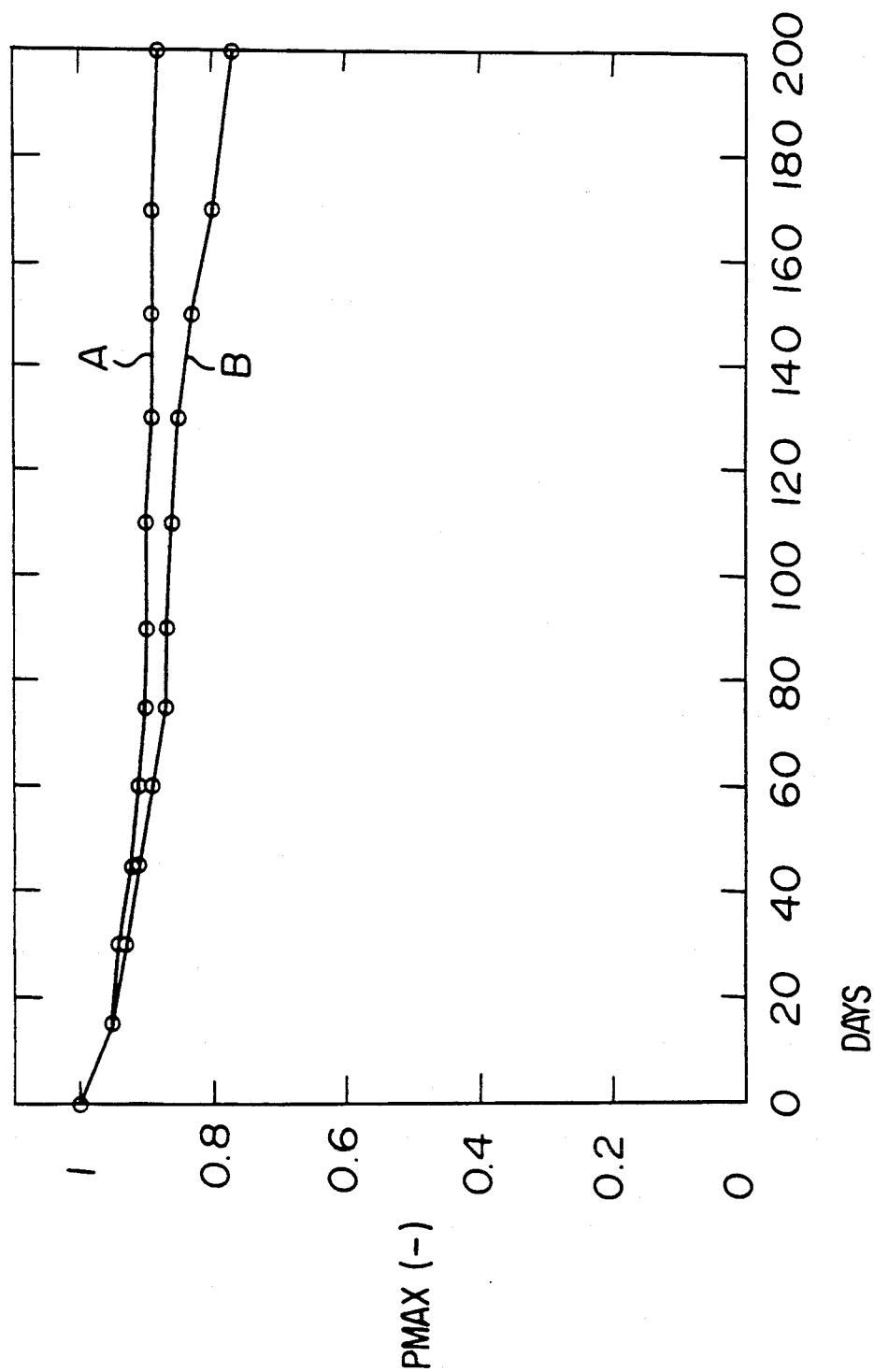
FIG. 10 shows a graph illustrating the deterioration tendency with the passage of time of the power output of the solar cells embedded in the sunroofs of Example 4 and Comparative Example 1 after being exposed to the atmosphere.

As can be seen from FIG. 10, the output power of a solar cell is more stable for a long period of time when ethylene-vinyl acetate having a less water content and a smaller moisture-permeability as the first interlayer in contact with the solar cell 2 (Example 4, Line A) is used in comparison with when polyvinyl butyral (Comparative Example 1, Line B) is used.

EXAMPLE 5

A window glass panel for a sunroof of an automobile was prepared by laminating an outer glass plate 1 of transparent float glass (thickness=2.0 mm, $T_v=7.5\%$) having a transparent solar cell 2 comprising a fluorine-containing tin oxide film (6,000 Å), p-type amorphous SiC layer (100 Å), i-type amorphous silicon layer (3,000 Å), n-type amorphous silicon layer (300 Å) and an Ag back electrode (400 Å) formed thereon on the inside of an automobile and an inner glass plate 5 of transparent float glass (thickness=2.0 mm) with an interlayer 4 (thickness=0.75 mm, $T_v=55\%$) of bronze-colored polyvinyl butyral interposed between the outer and the inner glass plates. The window glass panel was sealed along the entire peripheral margin with butyl rubber having a moisture-permeability of from 0.1 to 0.5 (g/hr/cm²/cm).

COMPARATIVE EXAMPLE 2

A window glass panel for a sunroof was prepard in the same manner as in Example 5, except that Thiokol having a moisture-permeability of 80 (g/hr/cm²/cm) was used as a sealing material.

COMPARATIVE EXAMPLE 3

A window glass panel for a sunroof was prepared in the same manner as in Example 5, except that silicone having a moisture-permeability of 350 (g/hr/cm²/cm) was used as sealing material.

Figure 11:
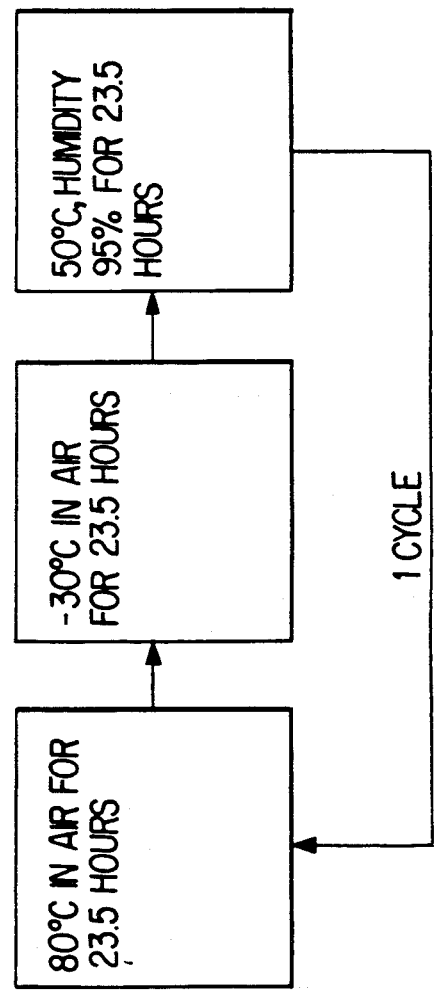
FIG. 11 is a diagram illustrating a temperature-humidity cycle test applied to the sunroofs prepared in accordance with Example 5, Comparative Examples 2 and 3.

The window glass panels as prepared in Example 5, Comparative Examples 2 and 3 were subjected to a temperature-humidity cycle test under the conditions shown in FIG. 11. The results are shown in FIG. 12

Other window glass panels prepared in the same manner as in Example 5, Comparative Examples 2 and 3 were exposed to the atmosphere, and the results are shown in FIG. 13.

Figure 12:
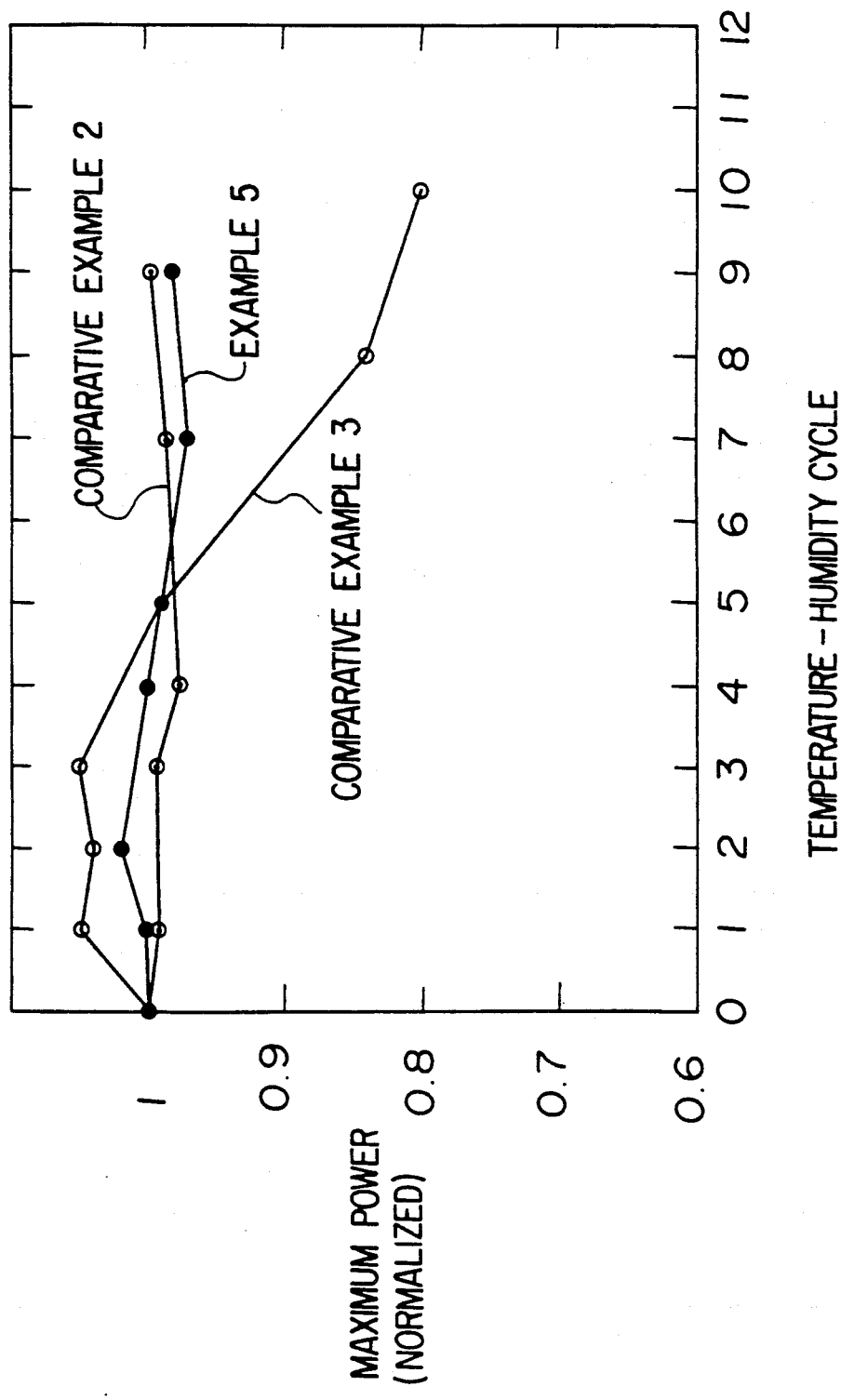
FIG. 12 shows a graph illustrating the deterioration in the power output of the solar cells embedded in the sunroofs of Example 5, Comparative Examples 2 and 3 after being subjected to the temperature-humidity cycle test as illustrated in FIG. 11.

As can be seen from FIGS. 12 and 13, the window glass panel sealed with Thiokol having a moisture-permeability of 8.0 (g/hr/cm²/cm) provided substantially same results in the temperature-moisture cycle test as Example 5, but provided poorer durability in the exposure test as compared with Example 5.

EXAMPLE 6

A winow glass pane for a sunroof of an automobile was prepared by laminating an outer glass plate 1 of transparent float glass (thickness=2.0 mm, $T_v=7.5\%$) having a transparent solar cell 2 comprising a fluorine-containing tin oxide film (6,000 Å), p-type amorphous SiC layer (100 Å), i-type amorphous silicon layer (3,000 Å), n-type amorphous silicon layer (300 Å) and a Ag back electrode (400 Å) formed thereon on the inside of an automobile and an inner glass plate 5 of transparent float glass (thickness=2.0 mm) with an interlayer 4 (thickness=0.75 mm, $T_v=55\%$) of bronze-colored polyvinyl butyral interposed between the outer and the inner glass plates. Vinyl chloride resin (moisture-permeability =15 g/hr/cm²/cm) was integrally molded by injection-molding to prepare a gasket 15 along the peripheral margin of the above solar cell-installed window glass panel.

EXAMPLE 7

A solar cell-installed window glass panel for a sunroof was prepared in the same manner as in Example 6, except that the window glass panel was sealed with epoxy resin (moisture-permeability =5 g/hr/cm²/cm) as a sealing material 14 and integrally molded with urethane type resin (moisture-permeability=170 g/hr/cm²/cm) to prepare a gasket 15 along the peripheral margin.

COMPARATIVE EXAMPLE 4

A solar cell-installed window glass panel for a sunroof was prepared in the same manner as in Example 6, except that neither a sealing material 14 nor a gasket 15 was formed.

COMPARATIVE EXAMPLE 5

A solar cell-installed window glass panel for a sunroof was prepared in the same manner as in Example 7, except that the sealing material 14 was omitted.

The above solar cell-installed window glass panels were subjected to the atmospheric exposure test to evaluate the lowering of the solar cell performance, and the test results are shown in Table 3.

TABLE 3

|  | Output power after 90 days/Initial output power |
|---|---|
| Example 6 | 0.88 |
| Example 7 | 0.90 |
| Comparative Example 4 | 0.53 |
| Comparative Example 5 | 0.61 |

We claim:

1. A glass substrate for a solar cell, comprising a glass sheet having a curved surface shape, a light-shielding layer formed along the periphery of the concave surface of said glass sheet, and a transparent electroconductive film formed to cover at least a portion of said light-shielding layer and the concave surface of said glass sheet.

2. The glass substrate for a solar cell according to claim 1, wherein said transparent electroconductive film is an electroconductive thin film comprising tin oxide as the main component.

3. The glass substrate for a solar cell according to claim 1, wherein said glass sheet has been subjected to a strengthening treatment.

4. A solar cell comprising the glass substrate as claimed in claim 1, an amorphous silicon (a-Si) semiconductor layer formed on the transparent electroconductive film formed on the concave surface side of the glass sheet, and a back electrode formed on the semiconductor layer.

5. A solar cell-installed window glass panel for an automobile, comprising the solar cell as claimed in claim 4 and a glass plate laminated on the back electrode side of the solar cell with an interlayer disposed therebetween.

6. A solar cell-installed window glass panel for an automobile, comprising a transparent glass plate with a light shielding layer formed along the periphery thereof, having a light-transmitting solar cell comprising amorphous silicon as a photoelectric convertion layer formed on the glass plate, and a transparent protective layer formed to cover said amorphous silicon solar cell.

7. A solar cell-installed window glass panel for an automobile, comprising a transparent outer glass plate having a light-transmitting solar cell formed on the inner side of said outer glass plate, comprising in order, a light-incident transparent electrode layer on said inner side of said outer glass plate, an amorphous silicon photoelectric conversion layer on said transparent electrode layer, and a transparent back electrode on said photoelectric conversion layer, and further including a transparent protective layer formed on said back electrode to cover said amorphous silicon solar cell wherein said protective layer is composed of a transparent interlayer adjacent said back electrode of said solar cell and a transparent inner glass plate laminated thereover and at least one of said interlayer and said inner glass plate is colored and transparent.

8. The solar cell-installed window glass panel for an automobile according to claim 7, wherein said transparent interlayer is composed of polyvinylbutyral.

9. The solar cell-installed window glass panel for an automobile according to claim 7, wherein said transparent interlayer is composed of an ethylene vinyl acetate copolymer layer.

10. The solar cell-installed window glass panel for an automobile according to claim 7, wherein said inner glass plate has a light-shielding colored layer along its peripheral margin to totally cover a current collective electrode formed on the peripheral margin of the inner side of said outer glass plate.

11. A solar cell-installed window glass panel for an automobile, comprising a transparent outer glass plate having a light-transmitting solar cell comprising amorphous silicon as a photoelectric conversion layer formed on the inner side of said outer glass plate, and a transparent protective layer formed to cover said amorphous silicon solar cell wherein said protective layer is composed of a transparent first interlayer formed on said amorphous silicon solar cell formed on the inner side of said outer glass plate, a transparent second interlayer formed on said first interlayer, and a transparent inner glass plate formed on said second interlayer.

12. The solar cell-installed window glass panel for an automobile according to claim 11, wherein at least one of said first interlayer, said second interlayer and said inner glass plate is colored and transparent.

13. The solar cell-installed window glass panel for an automobile according to claim 11, wherein said first interlayer has a moisture-permeability coefficient of not higher than 20 g/hr/cm$^2$/cm.

14. The solar cell-installed window glass panel for an automobile comprising a transparent glass plate having a light-transmitting solar cell comprising amorphous silicon as a photoelectric conversion layer formed on the glass plate, and a transparent protective layer formed to cover said amorphous silicon solar cell with a light shielding layer formed along the periphery thereof, wherein said solar cell has a visible light transmittance of not higher than 20%.

15. A solar cell-installed window glass panel for an automobile, comprising a transparent glass plate having a light-transmitting solar cell comprising amorphous silicon as a photoelectric conversion layer formed on the glass plate, and a transparent protective layer formed to cover said amorphous silicon solar cell wherein said glass plate has a light-shielding colored layer along the margin periphery thereof and a solar cell comprising an amorphous silicon photoelectric conversion layer to cover at least a portion of said light-shielding colored layer and the main surface of said glass plate, and said light-shielding colored layer is provided thereon with a current collective electrode of said solar cell.

16. The solar cell-installed window glass panel for an automobile, comprising a transparent glass plate having a light-transmitting solar cell comprising amorphous silicon as a photoelectric conversion layer formed on the glass plate, and a transparent protective layer formed to cover said amorphous silicon solar cell wherein said window glass panel has a resin-made gasket integrally molded along the entire peripheral margin and wherein said gasket is integrally molded together with an electrical circuit.

17. The solar cell-installed window glass panel for an automobile according to claim 16, wherein said electrical circuit includes a diode for preventing reverse current.

18. The solar cell-installed window glass panel for an automobile according to claim 16, wherein said electrical circuit is a circuit for stabilizing electric voltage.

19. The solar cell-installed window glass panel for an automobile according to claim 16, wherein said electrical circuit is a circuit for stabilizing electric current.

* * * * *

UNITED STATES PATENT AND TRADEMARK OFFICE
CERTIFICATE OF CORRECTION

PATENT NO. : 5,059,254

DATED : October 22, 1991

INVENTOR(S) : Susumu Yaba et al.

It is certified that error appears in the above-identified patent and that said Letters Patent is hereby corrected as shown below:

On the title page, Item [75]

The third inventor's first name has been omitted, should be, --Sinya--.

Signed and Sealed this

Ninth Day of March, 1993

Attest:

STEPHEN G. KUNIN

*Attesting Officer*  *Acting Commissioner of Patents and Trademarks*